United States Patent [19]
Shinohara

[11] Patent Number: 5,207,868
[45] Date of Patent: May 4, 1993

[54] ETCHING PROCESS FOR FILMS OF ALUMINUM OR ITS ALLOYS

[75] Inventor: Keiji Shinohara, Kanagawa, Japan

[73] Assignee: Sony Corporation, Tokyo, Japan

[21] Appl. No.: 757,642

[22] Filed: Sep. 11, 1991

[30] Foreign Application Priority Data

Sep. 11, 1990 [JP] Japan .................... 2-240486

[51] Int. Cl.⁵ .............................................. H01L 21/00
[52] U.S. Cl. ...................................... 156/656; 156/643; 156/646; 156/652; 156/665; 437/194; 437/190; 437/197
[58] Field of Search ............... 156/646, 665, 664, 656, 156/652, 643; 437/194, 197, 190

[56] References Cited
U.S. PATENT DOCUMENTS 4,148,705  4/1979  Battey et al. .................. 156/665
4,511,429  4/1985  Mizutani et al. ............... 156/665

FOREIGN PATENT DOCUMENTS 60-217634  10/1985  Japan .
63-108752   5/1988  Japan .
63-239950  10/1988  Japan .

Primary Examiner—Brian E. Hearn
Assistant Examiner—George Goudreau
Attorney, Agent, or Firm—Hill, Steadman & Simpson

[57] ABSTRACT

A process for etching an aluminum-based film disposed on a substrate is disclosed in which two specific different gases are used. One contains a hydrogen-donating gas in a volume of 10 to 99% and serves to etch and pattern the film until the substrate exposes to view, and the other is an oxidation-imparting gas for use in protecting the resulting pattern at its side walls. Over etching is attained without pattern defects.

10 Claims, 5 Drawing Sheets

RESIDUAL CHLORINE (AFTER ETCHING)

RESIDUAL CHLORINE (AFTER ETCHING)

ETCHING PROCESS FOR FILMS OF ALUMINUM OR ITS ALLOYS

BACKGROUND OF THE INVENTION

1. Field of the Invention

The present invention relates to a process for etching films of an aluminum-based material by using two specific different gases.

2. Description of the Prior Art

It is known that films of an aluminum metal or an aluminum alloy can be etched to form wirings for use in integrated circuits particularly in the manufacture of semiconductors. For convenience, such film is referred to simply as an Al film.

In an industrial sector of wirings for integrated circuits of semiconductors, Al films of a multilayered structure combined with a metallic barrier layer have recently been reputed for their good resistance to migration and to contact. This structure is made up typically of a film of Al or an Al alloy such as Al-Si and a barrier layer of TiON-Ti, TiW or TiW-Ti disposed integral with a lower side of the film.

Attempts have also been made to laminate a reflection-inhibiting layer such as of TiON of an inorganic class on or over an Al film. The inhibiting layer compensates for immunity from lithographic pattern defects which may take place from surface reflection of the Al film.

To meet the foregoing requirements, a laminate shown in FIG. 3 has been proposed to be etched. Designated at 1 is a film of an Al-Si alloy with an Si content of about 1% by weight, and a barrier layer 2 is interposed between the film 1 and a substrate 5 such as $SiO_2$. The barrier layer 2 is composed of a TiON layer 21 placed on a lower side or surface of the film 1 and a Ti layer 22 mounted on an upper surface of the substrate 5. An reflection-inhibiting layer 3 is disposed over the film 1, a TiON layer being here exemplified on which a resist mask 4 is positioned.

The composite material of FIG. 3, however, cannot be adequately processed by a mode of etching commonly employed to etch a single Al-Si film with good anisotropy. This is partly due to the reflection-inhibiting layer 3 being present between the resist mask 4 and Al-Si film 1 and partly due to the TiON and Ti layers 21, 22 being underneath the film 1. To be more specific, one-step or continuous etching is not applicable because the film 1 is necessarily overetched, as viewed in FIG. 2, under a set of conditions intended to etch the barrier layer 2.

FIG. 2 shows a structure resulting from etching the material of FIG. 3 on an electron cyclotron resonance (ECR)-etching system and under the following conditions.

gas: $BCl_3/Cl_2 = 60/90$ SCCM
pressure: 16 mTorr
microwave: 300 mA
RF bias: 40 W When the barrier layer 2 is satisfactorily etched, the Al-Si film 1 undergoes excessive etching owing to insufficient anisotropy and results in adverse undercutting. To solve this problem, Al films have been protected sidewise with deposits which may be generated from resist decomposition products upon exertion of incident ion energy to a greater extent. Although effective to improve anisotropy, such protection means is susceptible to the following drawbacks.

1. Etch selectivity is rendered small with respect to the resist and substrate.
2. In a step of over etching, both the resist and the resultant pattern at its side walls tend to involve objectionable sputtering arising out of the substrate. This in turn leads to a so-called after corrosion if a given etching gas contains a chlorine atom or atoms in the molecule Details as regards that corrosion are reported in "Semiconductors and Circuitry, 35th Symposium Prints", Pages 13–18, Article No. 3, December 1988.

Gases such as $SiCl_4$ and the like which are capable of deposition are in common use in protecting Al films. However, these gases will in most cases put an etching chamber into a full deposition atmosphere, entailing particle dusting or contamination.

SUMMARY OF THE INVENTION

With the foregoing drawbacks of the prior art in view, the present invention seeks to provide a new process for etching films of aluminum or its alloys which process enables sufficient anisotropy and adequate patterning without needing great ion energy and adverse gas of deposition capability and without involving objectionable undercut.

More specifically, the invention provides a process for etching an aluminum-based film of a composition structure including a substrate, which comprises: (a) etching and patterning the aluminum-based film with a gaseous mixture such that the substrate is exposed to the gaseous mixture containing a hydrogen-donating gas in an amount of 10 to 99% by volume, (b) forming a protective film at two opposite side walls of the resulting pattern with use of an oxidation-imparting gas, and (c) over-etching the protective pattern.

The above and other objects, features and advantages of the present invention will be better understood from the following description taken in conjunction with the accompanying drawings.

DETAILED DESCRIPTION OF THE INVENTION

Figure 1:
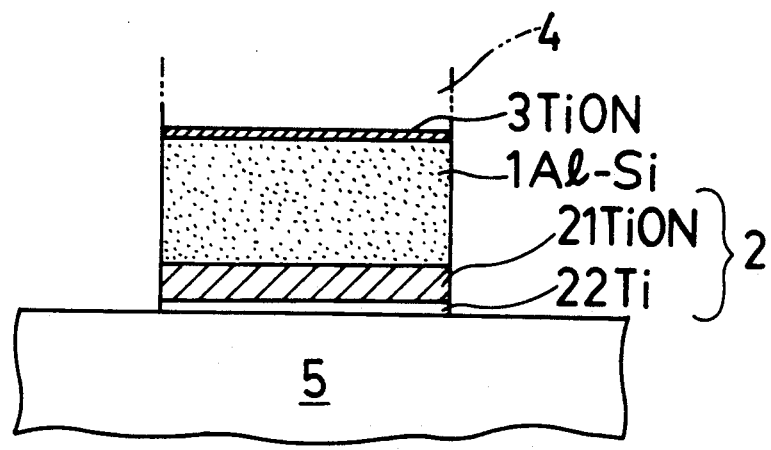
FIG. 1 is a cross-sectional view, taken diagrammatically and segmentally, of the etched structure provided in accordance with the present invention.
Figure 2:
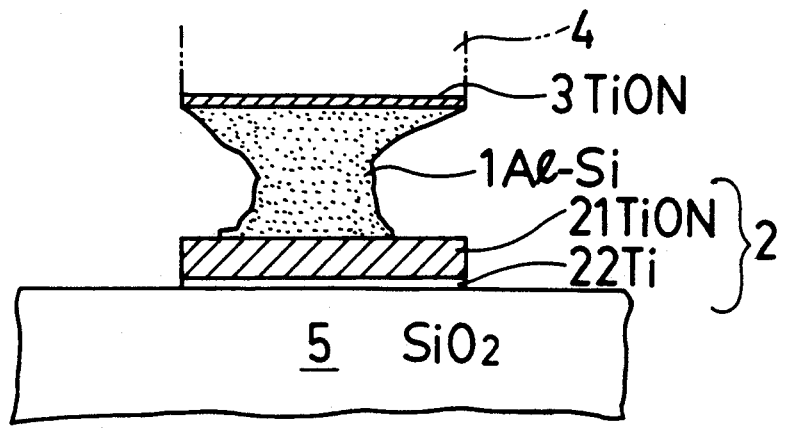
FIG. 2 is a view similar to FIG. 1, but illustrative of an etched structure of the prior art.

The process according to the present invention is contemplated for use in etching a selected class of aluminum-based films disposed over a suitable substrate commonly accepted in the art. One important aspect of the invention lies in effecting etching with two specified gases. One gas is a mixture of a hydrogen-donating gas and an etching gas, while the other is an oxidation-imparting gas. The gaseous mixture is used to etch and pattern a given aluminum-based film, and the resulting pattern is protected at its side walls with the oxidation-imparting gas.

Suitable hydrogen-donating gases are gases capable of generating hydrogen upon decomposition during etching, and they include hydrogen gas, hydrogen halide, hydrogen sulfide and compounds of non-metallic elements with hydrogen. Particularly preferred are HCl, HBr, and HF either alone or in combination. Those gases, hereunder called H-containing gases, should be rather small in, preferably free from, the ability to deposit. To this end C- or Si-containing gases are not feasible in the invention.

Etching gases used herein are not specifically restricted by conveniently selected from conventional etchants for Al materials. Typical examples include Cl-containing gases such as $BCl_2$, $Cl_2$ and a mixture thereof.

The H-containing gas may be admixed, with the etching gas, usually in the range of 10 to 99% by volume (% by flow rate). Taking etch rate in view, the volume of the first-mentioned gas may be greater than 20% and preferably range from 20 to 50%. This gaseous mixture may be incorporated, where desired, with any suitable known dilution gas.

Oxidation-imparting gases according to the invention should function to form a protective film such as an oxidation film at side walls of the Al film having become patterned by etching. They typically include $O_2$ (oxygen), $O_3$ (ozone), $NO$, $NO_2$ and the like which have an oxygen atom in the molecule. $O_2$ and $O_3$ are preferred in an electron discharge-free environment.

The H-containing gas according to the invention is by itself extremely small in deposition. This is particularly true of HCl. The gas generates, by the coaction with plasmas while in etching, hydrogen which reacts with a resist decomposition product ($C_zH_y$) to easily produce a carbonaceous deposit.

To implement the invention, a given film of an Al-based material may be etched with the above specified mixture of gasses until the substrate is allowed to come into sight. Prior to over etching, the resultant Al pattern should importantly be covered at its side walls with a protective film being formed by the action of the foregoing oxidation-imparting gas. The protective film acts to inhibit the pattern from getting sidewise attacked or otherwise undercut in a step of over-etching.

$CHCl_3$ is known to improve patterning but has a drawback in that, upon contact with plasmatic discharge, it leads to plasma contamination on the whole.

Even with use of Cl-containing gases, the process of the invention has been proven to notably reduce residual chlorine after etching and moreover after ashing.

The invention will now be described by way of the following examples which are provided for purposes of illustration only.

Figure 3:
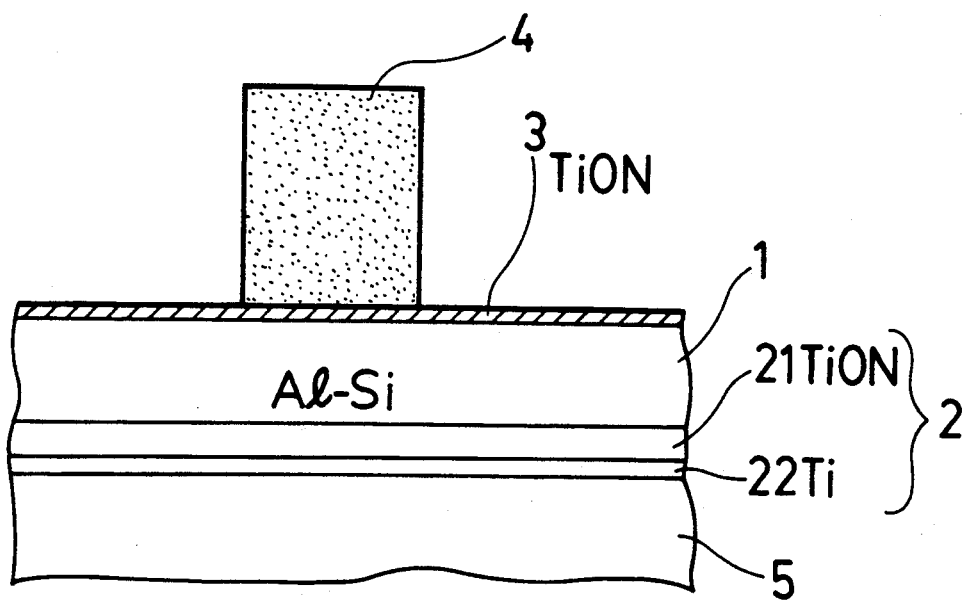
FIG. 3 is a cross-sectional view of one preferred form of the composite material to be etched by the invention.

A multilayered structure illustrated in FIG. 3 was employed for performance evaluation. The test structure was made up of a TiON reflection-inhibiting layer 3, an Al-Si film 1, a metallic barrier layer 2 and an $SiO_2$ substrate 5 laminated in the order mentioned. The aluminum alloy of the film 1 contained 1% by weight of Si, and the barrier layer 2 consisted of TiON layer 21 and a Ti layer 22.

Figure 4:
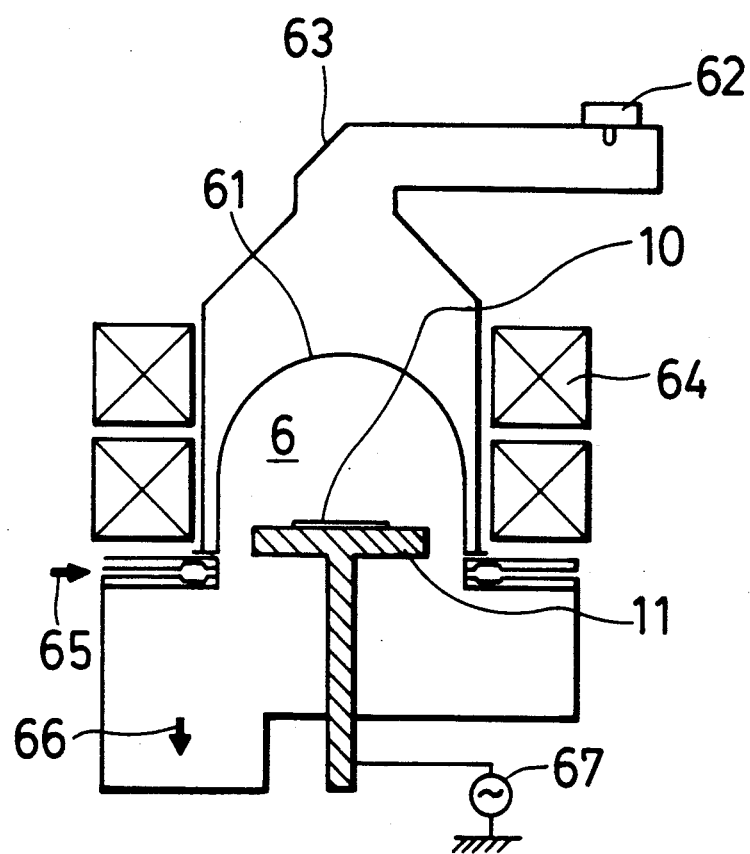
FIG. 4 is a vertically sectional view of an etching system used to carry out the invention.

In an inventive example, a first step of etching was conducted under a set of conditions given below.
   gas: $BCl_3/Cl_2/HCl = 60/40/100$ SCCM
   pressure: 16 mTorr
   microwave: 300 mA
   RF bias : 30 A An etching system of an ECR type was employed as seen in FIG. 4 which was comprised of a semiconductor wafer 10 to be etched, a susceptor 11 adapted to support thereon the wafer 10 and an etching chamber 6. A quartz bell jar was designated at 61, a magnetron at 62, a microwave conduit at 63, solenoid coils at 64 for formation of magnetic fields, an etching gas inlet at 65, an etching gas outlet at 66 and a high frequency power source at 67.

The gas in the inventive example was capable of exhibiting good anisotropy at an RF bias of 30 W. A comparative example using a prior art gas, $BCl_3/Cl_2$, called for an RF bias of 50 W.

The inventive gas, though suitable for over etching at a degree of about 30%, is liable to attach the resulting pattern at the side walls due to chlorine radicals being abundant at a degree of above 50%, thus leading to undercut. The inventive example, therefore, involves a second step of protection and a third step of over etching.

In the first step, etching was effected until the substrate was uncovered or exposed to view, followed by the protection in the second step under the following conditions.
   gas: $O_2 = 200$ SCCM
   pressure: 16 mTorr
   microwave: 300 mA
   RF bias: 0 W
   time: 2 sec.

The pattern was thus protected at the side walls with an oxidative film. In this instance, the resist was also etched at about 1000 Å.

Over etching was done in the third step. A set of conditions was employed as indicated below.
   gas: $BCl_3/Cl_2/HCl = 60/40/100$ SCCM
   pressure 16 mTorr
   microwave: 300 mA
   RF bias: 30 W Over etching was set at a degree of 50% in the inventive example. The conditions of over etching were similar to those for use in the first step. Other different gases specified above may of course be employed in the third step.

An adequately anisotropically etched product was obtained free from adverse undercut as illustrated in FIG. 1. These benefits have been found attributable to the protective film formed at the side walls of the pattern in the second step. This protective film would probably be regarded as a stable oxidative film and contributes greatly to protecting the pattern from becoming damaged or undercut sidewise by the attack of excessive chlorine radicals even with use of a Cl-containing gas such as HCl in the step of over etching.

Figure 5:
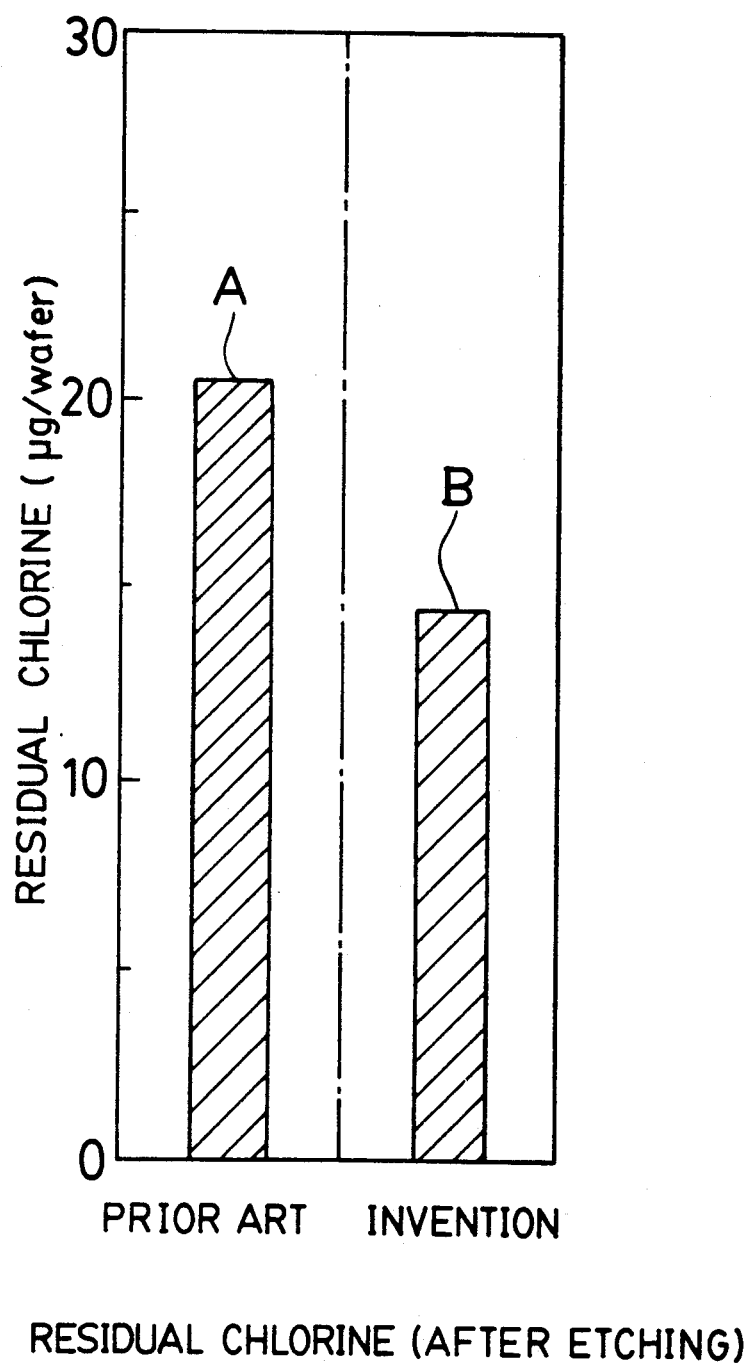
FIGS. 5 and 6 are charts which graphically represent the contents of residual chlorine in the structures of FIGS. 1 and 2.

It has also been found that the etched product according to the invention is reduced in the residual chlorine to an appreciable content even when over etching is done with an HCl-containing gas. In FIG. 5, the inventive and comparative samples are compared in regard to residual chlorine contents after etching. Comparative label A is as high as about 20 µg/wafer in that content as against about 15 µg of inventive label B. Similar contents after subsequent ashing are shown in pair in FIG. 6. Comparative labels A1 and A2 are of the same level at about 0.16 µg, whereas inventive label B1 is slightly above 0.1 µg and inventive label B2 slightly below 0.1 µg. From these analyses, the residual chlorine content is proved sufficiently small and reproducible in the inventive example.

Figure 6:
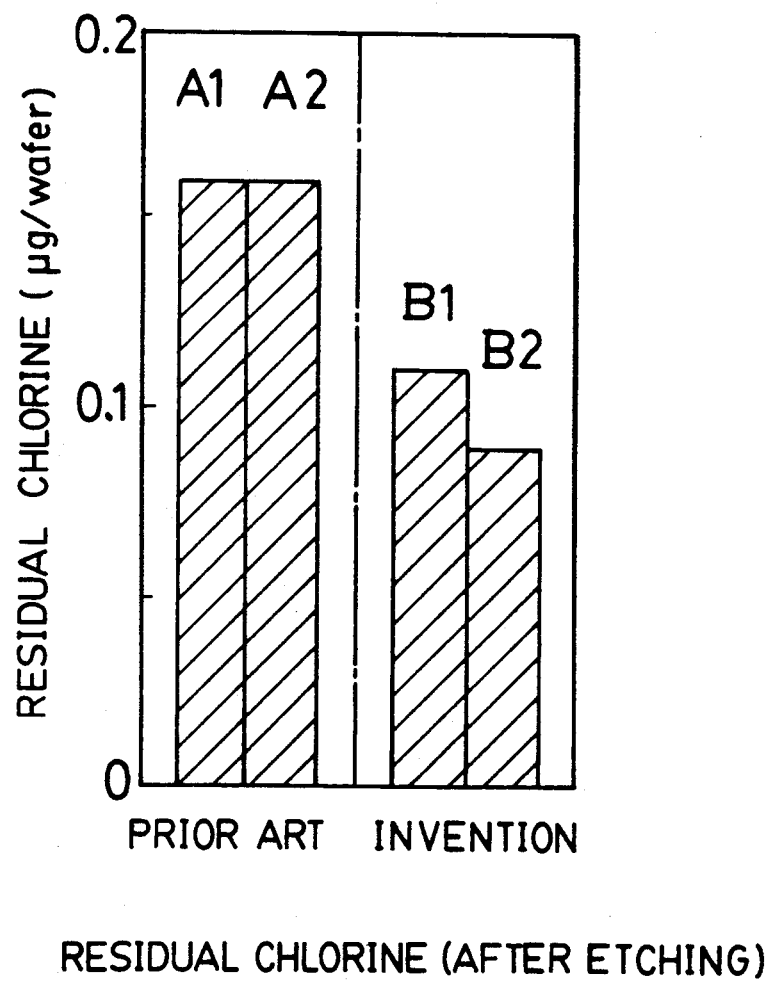

With respect to the results of FIG. 6, the inventive sample is made devoid of the protective film upon ashing and hence considered free from residual chlorine derivable from that film. This means that smaller contents of residual chlorine in the inventive example will accrue from use of a hydrogen-donating gas, thus leading to least after-corrosion. Full removal of the protective film on ashing is presumed to be due to the film being like a hydrocarbon sufficient to be easily detachable during ashing as HCl is responsible for formation of the film.

The content of residual chlorine was determined by putting a given amount of pure water onto an etched product, a wafer in these examples, and by allowing the same to stand for a given length of time, followed by analysis by ion chromatography.

According to the process of the invention, an aluminum-based film is etched with a selected hydrogen-containing gas immediately after the resultant pattern is treated with a selected oxidation-imparting gas and then subjected to over etching so that a product of good anisotropy is provided without side undercut. The second step of treatment is easy to perform for example with a stream of oxygen gas in the etching system.

Also advantageously, incident ion energy associated with RF bias is made small in quantity for instance from 50 W to 30 W. Lowered RF bias as result, even in the case of use of Cl-containing gases, in reduced Cl-rich sputters occurring from the substrate and hence reduced chlorine residues. Plasmatic treatment with oxygen gas in the second step will presumably aid in reducing residual chlorine. The less residual chlorine, the less after-corrosion. Particle dusting is totally absent as no gases of deposition capabilities are necessary.

What is claimed is:

1. A process for etching an aluminum-based film of a composite structure including a substrate with a barrier layer and the aluminum-based film being on the barrier layer, said process comprising the steps of:
   (a) etching and patterning said aluminum-based film by using a plasma with a gaseous mixture until the barrier layer of said substrate is exposed, said gaseous mixture containing a hydrogen-donating gas in an amount of 10 to 99% by volume;
   (b) then forming a protective film at two opposite sides walls of the resulting pattern by supplying an oxidation-imparting gas to the plasma; and
   (c) then over-etching the barrier layer with said hydrogen-donating gas.

2. A process according to claim 1 wherein said aluminum-based film is formed from aluminum alone or an aluminum-silicon alloy.

3. A process according to claim 1 wherein said hydrogen-donating gas is selected from a group consisting of hydrogen, hydrogen halide, hydrogen sulfide and a compound of a non-metallic element with hydrogen.

4. A process according to claim 3 wherein said hydrogen-donating gas is hydrogen chloride, hydrogen bromide or hydrogen fluoride.

5. A process according to claim 1 wherein said oxidation-imparting gas is selected from a group consisting of oxygen, ozone, nitrogen monoxide and nitrogen dioxide.

6. A process according to claim 1, wherein the structure includes a refraction inhibition layer on the aluminum-based film.

7. A process according to claim 6, wherein said inhibiting layer is TiON, said barrier layer is formed by a layer of Ti and a layer of TiON, and said aluminum-based film is Al-1%Si.

8. A process for etching an aluminum-based film of a composite structure including a substrate with a barrier layer, the aluminum-based film being on the barrier layer and a refraction inhibiting layer being on the aluminum-based film, said process comprising the steps of etching and patterning the refraction inhibiting layer and the underlying aluminum base film by using a plasma with a gaseous mixture until the barrier layer of the substrate is exposed, said gaseous mixture containing a hydrogen-donating gas in the amount of 10 to 99% by volume; then forming a protective film on each of the exposed side walls of the etched aluminum-based film by supplying a gas consisting of oxidation imparting material to the plasma; and then subsequently over-etching the barrier layer with said hydrogen-donating gas.

9. A process according to claim 8, wherein said inhibiting layer is TiON, said barrier layer is formed by a layer of Ti and a layer of TiON and the aluminum-based film is an Al-1%Si alloy, said hydrogen-donating gases being selected from a group consisting of hydrogen, hydrogen halide, hydrogen sulfide and a compound of non-metallic elements with hydrogen, and said oxygen imparting gas being selected from a group consisting of oxygen, ozone, nitrogen monoxide and nitrogen dioxide.

10. A process according to claim 9, wherein the hydrogen halide is selected from a group consisting of hydrogen chloride, hydrogen bromide and hydrogen fluoride.

* * * * *